US010100433B2

(12) United States Patent
Nebel et al.

(10) Patent No.: US 10,100,433 B2
(45) Date of Patent: Oct. 16, 2018

(54) SUBSTRATE HOLDER, PLASMA REACTOR AND METHOD FOR DEPOSITING DIAMOND

(71) Applicant: Fraunhofer-Gesellschaft zur Förderung der angewandten Forschung e.V., Munich (DE)

(72) Inventors: Christoph E. Nebel, Freiburg (DE); Wolfgang Müller-Sebert, Freiburg (DE); Claudia Widmann, Müllheim (DE); Nicola Heidrich, Freiburg (DE); Christoph Schreyvogel, Stegen (DE)

(73) Assignee: FRAUNHOFER-GESELLSCHAFT ZUR FÖRDERUNG DER ANGEWANDTEN FORSCHUNG E.V, Munich (DE)

( * ) Notice: Subject to any disclaimer, the term of this patent is extended or adjusted under 35 U.S.C. 154(b) by 107 days.

(21) Appl. No.: 14/937,359

(22) Filed: Nov. 10, 2015

(65) Prior Publication Data
US 2016/0138189 A1 May 19, 2016

(30) Foreign Application Priority Data
Nov. 14, 2014 (DE) .................. 10 2014 223 301

(51) Int. Cl.
*C30B 25/12* (2006.01)
*C23C 16/458* (2006.01)
*C30B 29/04* (2006.01)
*C23C 16/27* (2006.01)
*C30B 25/20* (2006.01)

(52) U.S. Cl.
CPC ............ *C30B 25/12* (2013.01); *C23C 16/274* (2013.01); *C23C 16/276* (2013.01); *C23C 16/458* (2013.01); *C23C 16/4581* (2013.01); *C30B 25/20* (2013.01); *C30B 29/04* (2013.01)

(58) Field of Classification Search
CPC combination set(s) only.
See application file for complete search history.

(56) References Cited

U.S. PATENT DOCUMENTS

| 5,209,182 A * | 5/1993 | Ohta ....................... C23C 16/46 117/99 |
| 5,397,396 A | 3/1995 | Kosky et al. |
| 5,474,612 A | 12/1995 | Sato et al. |
| 2002/0017363 A1 | 2/2002 | Nakashima et al. |
| 2006/0266279 A1* | 11/2006 | Mokuno ................. C30B 25/20 117/68 |
| 2009/0239078 A1* | 9/2009 | Asmussen ............. C23C 16/274 428/408 |

(Continued)

FOREIGN PATENT DOCUMENTS

| DE | 693 05 238 T2 | 12/1993 |
| DE | 103 23 085 A1 | 12/2004 |

(Continued)

Primary Examiner — Erin F Bergner
(74) Attorney, Agent, or Firm — Brinks Gilson & Lione

(57) ABSTRACT

A substrate holder having a base plate where a plurality of protruding poles is arranged, said poles spaced apart from one another by intermediate spaces. Alternatively or in addition, a plasma reactor for depositing diamond from the gas phase may be provided, the plasma reactor comprising such a substrate holder. A method for depositing diamond from the gas phase may be provided.

18 Claims, 3 Drawing Sheets

(56) References Cited

U.S. PATENT DOCUMENTS

2010/0012022 A1* 1/2010 Hemley ............... C30B 25/105
   117/97
2012/0145080 A1   6/2012 Park et al.
2012/0234229 A1*  9/2012 Nguyen ............... C30B 25/12
   117/88

FOREIGN PATENT DOCUMENTS

| DE | 10 2013 012 082 A1 | 1/2015 |
| EP | 0 573 943 A1 | 12/1993 |
| WO | WO 03/040440 A2 | 5/2003 |
| WO | WO 2012/084655 A2 | 6/2012 |

* cited by examiner

SUBSTRATE HOLDER, PLASMA REACTOR AND METHOD FOR DEPOSITING DIAMOND

CROSS-REFERENCE TO RELATED APPLICATIONS

This application claims priority under 35 USC § 119 to German Patent Application No. DE 10 2014 223 301.1, filed Nov. 14, 2014, the entire contents of which are hereby incorporated herein by reference.

BACKGROUND

The invention relates to a substrate holder having a base plate. The invention also relates to a plasma reactor for depositing diamond, comprising such a substrate holder, and to a method for depositing diamond from the gas phase.

Such a method is known from WO 2003/040440 A2. In this known method, a monocrystalline diamond is arranged as a substrate on the base plate of a substrate holder and heated to a temperature of above 900° C. by means of an assigned heating device. Plasma containing hydrogen, nitrogen and methane is ignited above the surface of the substrate. A diamond layer is subsequently deposited on the substrate at a growth rate of 1 to 3 µm/h. The diamond layer deposited from the gas phase grows with the crystal direction predetermined by the substrate, and therefore it is also possible to deposit a monocrystalline diamond layer in the case of a substrate from monocrystalline diamond.

However, this known method has the drawback that individual substrates from monocrystalline diamond only have a small size. In order to efficiently carry out the method, the base plate of the substrate holder can be equipped with a plurality of substrates which can be coated at the same time. However, the drawback is that these individual substrates are then interconnected by a polycrystalline diamond layer deposited from the gas phase. Thereafter, the individual substrates must be separated upon conclusion of the growth process, e.g. by being removed using the laser cutting method. This damages the substrate holder, and therefore a new substrate holder always has to be provided for the repeated conduction of the method.

BRIEF DESCRIPTION OF THE DRAWINGS

The embodiments may be better understood with reference to the following drawings and description. The components in the figures are not necessarily to scale.

DETAILED DESCRIPTION

Figure 1:
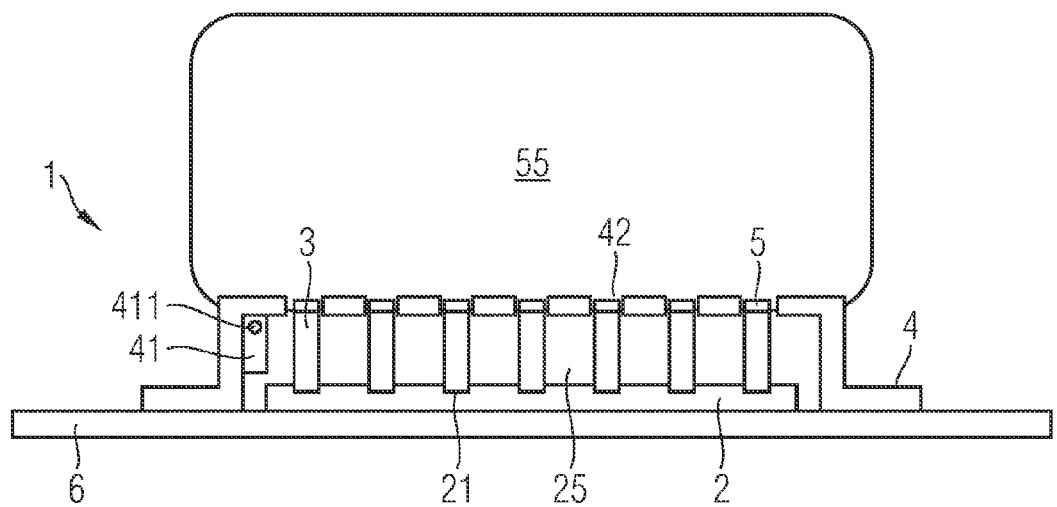
FIG. 1 shows a cross-section through a substrate holder.

On the basis of the prior art, the object of the invention is to provide a method and apparatuses, by means of which a plurality of substrates can be provided with a diamond layer with little effort.

According to the invention, this object is achieved by a substrate holder according to claim 1, a plasma reactor according to claim 10 and a method according to claim 11. Advantageous developments of the invention are found in the subclaims.

The invention proposes a substrate holder having a base plate which is provided with a plurality of protruding poles. Adjacent poles are spaced apart from one another by intermediate spaces. In some embodiments of the invention, the base plate and/or the poles can contain or consist of a refractory metal, e.g. molybdenum, tungsten or tantalum. In other embodiments, the substrate holder can contain or consist of silicon or stainless steel. In some embodiments of the invention, different materials can be used for the base plate and the poles.

The poles protruding beyond the plane defined by the base plate are provided to receive at least one substrate each. As a result, the substrates are also spaced apart by intermediate spaces. Therefore, an undesired polycrystalline diamond layer which leads on to the growing-together of several substrates is prevented from forming between the substrates. After the overgrowing with the diamond layer from the gas phase, individual substrates can easily be removed from the poles without another separation step having to be carried out, e.g. by being removed using the laser cutting method.

Nevertheless, it is also possible to arrange several substrates in an almost joint-free fashion on an individual pole to overgrow these substrates with a joint monocrystalline diamond layer. If there is no or only a small gap between the individual substrates, adjacent substrates overgrow with a monocrystalline diamond layer, and therefore the layer deposited from the gas phase can be larger than the surface area of an individual substrate.

In some embodiments of the invention, the individual poles can have equal lengths, and therefore the pole end faces intended for receiving the substrates lie in a plane. This serves for achieving a uniform influence of the plasma used for the deposition on the substrates and thus a uniform layer deposition.

In some embodiments of the invention, the end face of the poles can be larger than or equal to the surface area of the substrates. As a result, the substrates can rest on the poles all-over so as to enable a good heat transfer and a safe mechanical attachment.

In some embodiments of the invention, the cross-sectional area of the poles can be less than the surface area of the substrates. As a result, the rims of the substrates are not in contact with the poles of the substrate holder so as to avoid a growing of the substrates onto the poles and the formation of polycrystalline diamond layers on the subareas of the pole end face, which are not covered by the substrate. This can improve the quality of the coated substrates and facilitate a removal of the substrates from the substrate holder upon the conclusion of the coating process.

In some embodiments of the invention, the poles and the base plate can be made in one piece. For example, the poles can be carved out of a base plate by milling, sawing or etching. This embodiment enables a good heat transfer from base plate to the pole end faces receiving the substrates and a mechanically robust design of the substrate holder.

In some embodiments of the invention, the poles can be received in assigned bores of the base plate. As a result, different materials can be used for poles and base plate. This enables an adaptation of the thermal conductivity of the poles to predeterminable target values so as to control the substrate temperature adjusting during coating. This temperature results, on the one hand, from the energy input from the plasma influencing the substrates and, on the other hand, from the heat input and/or the heat dissipation via base plate and poles. Furthermore, the substrate holder can be made in an easier and/or more cost-effective way when the poles are received in assigned bores of the base plate. Finally, different poles, e.g. having different cross-sectional areas, being made from different materials or having different lengths, can be inserted in the bores of the base plate to always enable optimum deposition conditions and thus high-quality layers for different substrates and/or different coating processes.

In some embodiments of the invention, the pole can have a bore which runs along the longitudinal extension of the pole or parallel to the longitudinal extension of the pole. Such a bore can be provided to reduce the heat dissipation via the base plate by reducing the pole cross-section which is effective for heat conduction. In other embodiments of the invention, the bore can receive a heating element, e.g. a fluid channel for a heat transfer medium or an electric heating resistor. In other embodiments of the invention, the substrate and the pole end face receiving the substrate can be cooled through the bore, e.g. by circulating a heat transfer medium in the bore.

In some embodiments of the invention, each pole can have a length and/or width or diameter of about 1 mm to about 10 mm. The cross-section of the pole can be polygonal or round. The cross-section of the pole can be constant or variable across the longitudinal extension. For example, the heat transport across the base area can be reduced when the cross-section is reduced, or the heat supply and/or heat dissipation across the base plate can be increased when the cross-section is increased towards the base plate.

In some embodiments of the invention, each pole can have a height of about 3 mm to about 10 mm. This enables a sufficiently large distance of the end faces of the poles and thus of the substrates from the base plate so as to prevent a growing-together of the substrates even in the case of the undesired coating of the base plate from the plasma.

In some embodiments of the invention, the base plate can carry about 40 to about 150 poles. In other embodiments of the invention, the base plate can carry about 60 to about 80 poles. It is thus possible to coat several substrates at the same time, and it is thus possible to coat a plurality of substrates more rapidly and in the individual case more uniformly in just one coating process.

In some embodiments of the invention, the substrate holder can contain an optional cover plate which has a plurality of bores receiving the poles. This feature has the effect that there are no field elevations on the rims of the poles and/or on the rims of the substrates when the substrate holder is at a potential other than the earth potential. In this case, an electrically conductive cover plate effects a homogenization of the electric field. As a result, a uniform plasma cloud or plasma lens can form as in a previously known planar substrate holder. Effects of the poles on the coating process can thus be reduced or avoided.

In some embodiments of the invention, a gap of about 0.3 mm to about 1 mm can exist between the rim of the bores of the cover plate and the outer edges of the poles. Such a gap can serve for thermally decoupling the poles and the cover plate. As a result, the substrates and the end faces of the poles have a temperature other than that of the cover plate. As a result of this, the layer deposition from the plasma can be influenced so as to produce e.g. a diamond layer on the substrates and a diamond-like carbon layer, a graphite layer or no layer at all on the cover plate. It is thus possible to reliably prevent polycrystalline diamond from forming on the cover plate, said diamond connecting the individual substrates on the respective poles to one another, as a result of which another complicated separation method would have to be carried out to separate the coated substrates.

In some embodiments of the invention, the temperature of the substrates can be greater than about 700°, greater than about 800° or greater than about 900°. In some embodiments of the invention, the temperature of the cover plate can be less than about 600° or less than about 500° or less than about 400° C. In this case, a diamond layer can be produced on the substrates from plasma which contains hydrogen and at least one hydrocarbon, whereas the cover layer remains largely uncoated since the etch rate of the hydrogen plasma is higher than the deposition rate of the carbon atoms at the lower temperature.

In some embodiments of the invention, the end faces of the poles can be arranged about 0.3 mm to about 1.5 mm or about 0.5 to about 0.8 mm below the exterior surface of the cover plate. As a result, the exterior surface of the cover plate and the substrate surface area intended for coating can be arranged almost in a plane so as to achieve a homogeneous plasma effect since the field line course is not disturbed by the bores of the cover plate 4.

In some embodiments of the invention, the cover plate can contain a cooling device. As a result, the heat input can be dissipated from the plasma, and therefore the cover plate 4 has a lower temperature than the end face of the poles and the substrates.

In some embodiments of the invention, the cover plate can be provided with fluid channels in which a heat transfer medium can circulate. Depending on the temperature of the heat transfer medium, thermal energy can be supplied to or dissipated from the cover plate. As a result, the cover plate can adopt a desired lower or higher temperature. The heat transfer medium can be liquid or gaseous. For example, water, vapor, an oil or compressed air can be used as a heat transfer medium.

In some embodiments of the invention, the cover plate can be connected to a temperature measuring apparatus, and therefore the temperature of the cover plate can be controlled or regulated.

In some embodiments of the invention, the substrates can be attached to the end faces of the poles by soldering. This serves for preventing the substrates from getting out of place when the plasma vessel is evacuated, when the plasma vessel is aerated or when electric fields have an effect and there is an undesired heat transfer to the cover plate. Furthermore, the thermal coupling of the substrates to the poles can be improved by soldering using a metallic solder.

The invention is explained in more detail below by means of figures without limiting the general inventive concept, wherein FIG. 1 shows a cross-section through the substrate holder according to the invention.

Figure 2:
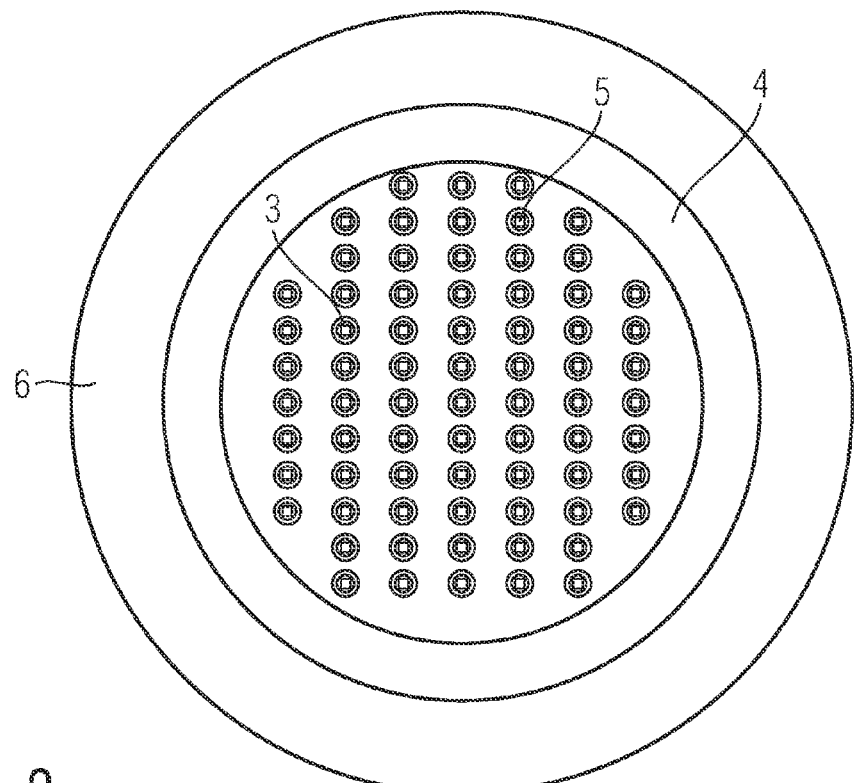
FIG. 2 shows a top view of a first embodiment of the substrate holder.

FIG. 2 shows a top view of a first embodiment of the substrate holder according to the invention.

Figure 3:
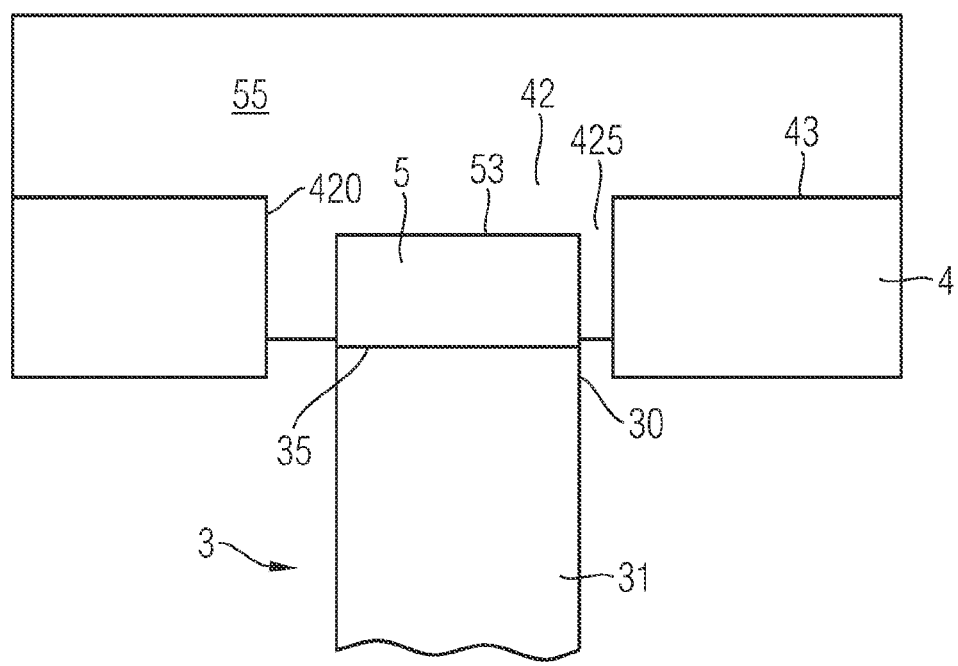
FIG. 3 shows an enlarged section from FIG. 1.

FIG. 3 shows an enlarged section from FIG. 1.

Figure 4:
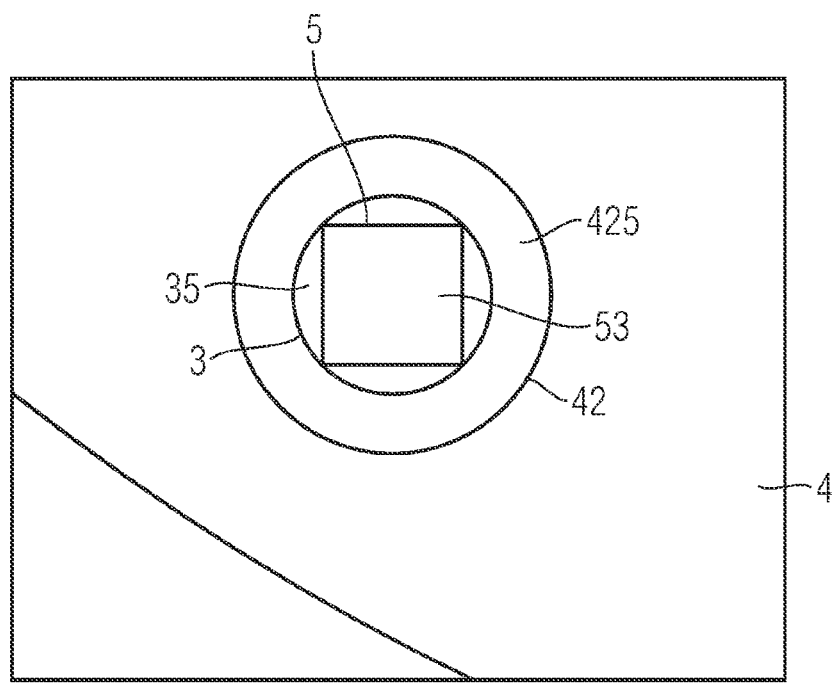
FIG. 4 shows an enlarged section from FIG. 2.

FIG. 4 shows an enlarged section from FIG. 2.

Figure 5:
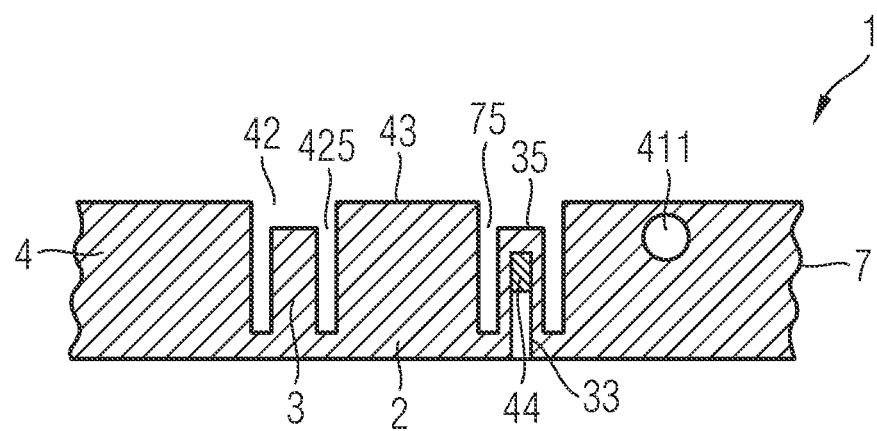
FIG. 5 shows a second embodiment of a substrate holder.

FIG. 5 shows a second embodiment of a substrate holder according to the invention.

A first embodiment of the substrate holder according to the invention is explained by means of FIGS. 1, 2, 3 and 4. In this connection, FIGS. 1 and 3 both show a cross-section through the substrate holder and FIGS. 2 and 4 show a top view of the substrate holder. FIG. 3 shows a detail from FIG. 1, and FIG. 4 shows a detail from FIG. 2. The same reference signs are used for the same components of the invention.

As is clear from FIG. 1, the substrate holder 1 contains a base plate 2, which carries a plurality of protruding poles 3. Adjacent poles 3 are separated from one another by intermediate spaces 25. In the embodiment as shown, the poles 3 are received in assigned bores 21 of the base plate 2. The longitudinal axis of the poles is approximately perpendicular to the plane defined by the base plate 2. In the exemplary embodiment as shown, the poles have equal length, and therefore the end faces 35 thereof also lie in a plane.

When a plasma reactor equipped with the substrate holder 1 is operated, the base plate 2 rests on a substrate support 6 of the plasma reactor. The substrate support 6 can be equipped with a heating device or a cooling device to thus control the temperature of the base plate 2 and as a result also the temperature of the poles 3. In addition, the substrate support 6 can be electrically insulated with respect to the metallic boundary walls of the plasma reactor so as to bring the substrate support 6 by means of an electric voltage source or by electric charging from the plasma to a predeterminable electric potential with respect to the earth potential.

In some embodiments of the invention, the base plate 2 and the poles 3 of the substrate holder 1 can consist of or contain a refractory metal. For example, the base plate 2 and the poles 3 can consist of or contain molybdenum or a molybdenum alloy.

At least one substrate 5 each can be applied to the end faces 35 of the poles 3. The substrate 5 can have e.g. a length of about 2 mm to about 10 mm or of about 4 mm to about 6 mm. The substrate 5 can also have a width of about 2 mm to about 10 mm or of about 4 mm to about 6 mm. The thickness of the substrate 5 can be between 0.1 mm and about 1 mm. In some embodiments of the invention, the thickness of the substrate 5 can be about 0.3 mm to about 0.6 mm. In some embodiments of the invention, the substrate 5 can contain or consist of a monocrystalline diamond.

As shown in FIG. 3 and FIG. 4, the shaft 31 of the pole 3 has an approximately round cross-section and the substrate 5 has an approximately square basic form. The diameter of the shaft 31 of the pole 3 is chosen in such a way that the pole 3 forms a circle circumscribing the polygonal substrate 5. This serves for enabling a simple production of the poles 3, e.g. as a rotary part, on the one hand. However, the uncovered subarea of the end face 35 of the pole 3 is also minimized, and therefore this area is not covered with undesired large-area deposits of layers from the plasma, e.g. polycrystalline diamond layers.

Since thus adjacent substrates 5 are also spaced apart by intermediate spaces 25, they cannot grow together by undesired layer deposition beyond the boundaries of adjacent substrates 5. A complicated separation of the substrates 5 at the end of the coating process can be avoided in this way. Yet it is possible to simultaneously coat several substrates on several poles to thus minimize the time required for coating a plurality of substrates.

FIGS. 1 to 4 also show an optional cover plate 4 which has a plurality of bores 42 where the poles 3 are received. As is clear from FIGS. 3 and 4, a bore 42 is chosen in such a way that there remains a gap 425 between the rim 420 of bore 42 and the outer edges 30 of the poles 3. This serves for avoiding a thermal contact between the substrates 5 and the cover plate 4, and therefore there are no undesired thermal losses. In some embodiments of the invention, the gap 425 can have a width of about 0.3 mm to about 1 mm or of about 0.4 to about 0.6 mm. The end faces 35 of the poles 3 can be arranged about 0.3 mm to about 1.5 mm or about 0.5 to about 0.8 mm below the exterior surface 43 of the cover plate 4. Therefore, the surface 53 of the substrate 5, which is intended for coating, can lie in a plane with the exterior surface 43 of the cover plate 4. Alternatively, as shown in FIG. 1, the surface 50 of the substrate 5 can be below the plane defined by the exterior surface 43 of the cover plate 4, and therefore the then newly formed exterior surface of the substrate 5 becomes flush with the exterior surface 43 or protrudes beyond the exterior surface 43 as a result of the layer structure during the coating process or upon conclusion of the coating process. The cover plate 4 can have the same electric potential as the base plate 2, the poles 3 and the substrates 5, and therefore the plasma 55 forming during the operation of the plasma reactor is confronted with an almost homogeneous equipotential surface. The field inhomogeneity caused by the poles 3 and the intermediate spaces 25 can be shielded from plasma by the electrically conductive cover plate 4.

FIG. 1 also shows a cooling device 41. In the embodiment as shown, said cooling device contains at least one fluid channel 411 through which a cooling gas or liquid flow can be passed. The position and number of cooling devices 41 or fluid channels 411 should merely be comprehended as an example and can differ in other embodiments of the invention.

The cooling device 41 enables to keep the exterior surface 43 of the cover plate 4 at a lower temperature than the surface 53 of the substrates 5. Due to this, the type of layer deposited from the plasma 55 or the deposit rate thereof can be influenced. In some embodiments of the invention, a layer deposition from the plasma 55 can be fully prevented by lowering the temperature of the exterior surface 43. As a result, the substrates 5 cannot grow together due to a layer deposition on subareas of the exterior surface 43 of the cover plate 4, and therefore the substrates 5 do not have to be separated after the conclusion of the layer deposition even if a cover plate 4 is available.

During the operation of the plasma reactor, the plasma 55 can be produced in generally known manner by microwave radiation. For example, the plasma 55 can contain hydrogen and a hydrocarbon, e.g. methane. In this case, a diamond layer can be deposited on the substrates 5 from the plasma 55. In other embodiments of the invention, the plasma 55 can contain hydrogen and silane to thus produce a silicon layer on the substrates 5. In addition, the plasma can contain dopants, e.g. nitrogen, phosphorus or boron, which are incorporated into the resulting layer to produce predeterminable electric and/or optical properties.

FIG. 5 shows a second embodiment of the substrate holder according to the present invention. In this connection, FIG. 5 shows a cross-section through a subarea of the substrate holder 1. Equal components of the invention are provided with equal reference signs.

As is clear from FIG. 5, the base plate 2, the poles 3 and the cover plate 4 are made from a single material layer 7 as a single piece. The top side of the material layer 7 here forms the external side 43 of the cover plate 4. The bottom side of the material layer 7 forms the base plate 2. The poles 3 are formed by introducing trenches 75 into the material layer 7. This leads to the formation of gaps 425 between the poles 3 and the bores 42. Both the trenches 75 and the bores 42 can be produced by machining, e.g. by sawing, drilling or milling. Alternatively, the trenches 75 can also be produced by primary forming the material layer 7, e.g. by molding or drop forging. Such an integral substrate holder 1 can be produced more easily or can have advantageous properties with respect to the multi-piece substrate holder shown in FIG. 1.

The material layer 7 can consist of at least one metal or one alloy. The material layer 7 can contain or consist of e.g. molybdenum. In some embodiments of the invention, the material layer 7 can have a multi-layered structure, and therefore different subareas have different thermal or electric properties.

In order to control the temperatures of the external side 43 of the cover plate 4 and the end faces 35 of the poles 3, it can be possible that the material layer 7 contains fluid channels 411 by means of which the external side 43 can be cooled. In this case as well, the position and number of fluid channels 411 can merely be chosen by way of example and can differ in other embodiments of the invention.

In order to heat the end face 35 and thus the substrates 5 to a higher temperature, some embodiments of the invention can provide to introduce an optional bore 33 into the poles 3. In the exemplary embodiment as shown, the bore 33 is made as a blind hole. However, in some embodiments of the invention, it can also be made as a through-hole.

The bore 43 can be rinsed with a heat transfer medium which releases thermal energy to the poles 3 and in doing so heats the end face 35. The bore 43 can be rinsed with a heat transfer medium which absorbs thermal energy from the pole 3, thus reducing the heat of the end face 35.

In other embodiments of the invention, the bore 33 can merely be provided to reduce the cross-section of the pole 3, which is effective for thermal conduction, so as to adjust a higher equilibrium temperature between substrate 5 and end face 35 in the case of an energy deposition from the plasma.

In yet other embodiments of the invention, an electric heating resistor 44 can be arranged in the bore 33, said resistor directly controlling the temperature of the pole 3 and/or the end face 35 thereof. In this case, different substrates 5 can be coated at a different temperature when the heat release of the respectively assigned heating resistors 44 can be regulated separately from one another.

Of course, the invention is not limited to the embodiment shown in the figures. Therefore, the above description should not be regarded as limiting but as explanatory. The following claims should be comprehended in such a way that a feature mentioned is available in at least one embodiment of the invention. This does not exclude the presence of further features. In so far as the claims and the above description define "first" and "second" embodiments, this designation serves for distinguishing between two similar embodiments, without determining an order. Features from different embodiments of the invention can be combined at any time to thus obtain further embodiments of the invention. Although the invention has been explained on the basis of an example of a diamond deposition from plasma which contains at least hydrogen and methane, the use of the substrate holder is not limited to this exemplary embodiment.

We claim:

1. A substrate holder comprising:
   a base plate, wherein a plurality of protruding poles is arranged on the base plate, said poles spaced apart from one another by intermediate spaces; and
   a cover plate having a plurality of bores configured to receive the poles and to receive a plurality of substrates on end faces of the poles, wherein a first gap is present between a rim of the bores and outer edges of the poles, and wherein a second gap is present between a bottom of the cover plate and a top of the base plate.

2. The substrate holder of claim 1, wherein the poles and the base plate are made as a single piece.

3. The substrate holder of claim 1, wherein the poles are received in assigned bores of the base plate.

4. The substrate holder of claim 1, wherein each pole has at least one of a length, a width, or a diameter of about 1 mm to about 10 mm or wherein each pole has a height of about 3 mm to about 10 mm.

5. The substrate holder of claim 1, wherein the first gap has a distance within a range of about 0.3 mm to about 1 mm.

6. The substrate holder of claim 1, wherein end faces of the poles are arranged about 0.3 mm to about 1.5 mm or about 0.5 mm to about 0.8 mm below an exterior surface of the cover plate.

7. The substrate holder of claim 1, wherein the cover plate contains a cooling device or the cover plate is provided with fluid channels in which a heat transfer medium can circulate.

8. The substrate holder of claim 1, wherein each of the poles is provided with one assigned heating device.

9. A plasma reactor for depositing diamond from a gas phase, the plasma reactor comprising:
   a substrate holder having a base plate, wherein a plurality of protruding poles is arranged on the base plate, said poles spaced apart from one another by intermediate spaces; and
   a cover plate having a plurality of bores configured to receive the poles and to receive substrates that are on end faces of the poles, wherein a first gap is present between a rim of the bores and outer edges of the poles, and wherein a second gap is present between a bottom of the cover plate and a top of the base plate.

10. The substrate holder of claim 1, wherein no diamond from a gas phase is deposited between adjacent substrates that are coupled to the poles.

11. The substrate holder of claim 1, wherein the substrates are soldered to the poles.

12. The substrate holder of claim 11, wherein the substrates comprise monocrystalline diamond.

13. The substrate holder of claim 1, wherein the base plate is provided with, or is in contact with, at least one heating device.

14. The substrate holder of claim 1, wherein each of the poles is provided with one assigned heating resistor.

15. The substrate holder of claim 1, wherein the substrates comprise a monocrystalline diamond.

16. The substrate holder of claim 1, wherein the base plate, the cover plate, and the poles are arranged so that an exterior surface of the substrates lie in a plane defined by an exterior surface of the cover plate.

17. The substrate holder of claim 1, wherein each of the end faces of the poles is equal to a surface area of each corresponding one of the substrates.

18. The substrate holder of claim 1, wherein each of the end faces of the poles are configured to receive a corresponding one of the substrates.

* * * * *